(12) United States Patent
Okada et al.

(10) Patent No.: US 9,261,564 B2
(45) Date of Patent: Feb. 16, 2016

(54) BATTERY CELL CONTROL SYSTEM AND METHOD

(75) Inventors: Kanako Okada, Ebina (JP); Hayato Nagakura, Atsugi (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 648 days.

(21) Appl. No.: 13/701,724

(22) PCT Filed: May 11, 2011

(86) PCT No.: PCT/JP2011/002638
§ 371 (c)(1),
(2), (4) Date: Dec. 3, 2012

(87) PCT Pub. No.: WO2011/151976
PCT Pub. Date: Dec. 8, 2011

(65) Prior Publication Data
US 2013/0076365 A1    Mar. 28, 2013

(30) Foreign Application Priority Data

Jun. 4, 2010  (JP) .................................. 2010-128449

(51) Int. Cl.
| | | |
|---|---|---|
| *G01R 31/36* | (2006.01) | |
| *G01R 21/00* | (2006.01) | |
| *G01R 19/00* | (2006.01) | |
| *H02J 7/00* | (2006.01) | |
| *G01N 27/416* | (2006.01) | |
| *H01M 10/48* | (2006.01) | |

(52) U.S. Cl.
CPC .......... *G01R 31/362* (2013.01); *G01R 31/3658* (2013.01); *H01M 10/482* (2013.01); *H02J 7/0021* (2013.01); *Y02T 10/7055* (2013.01)

(58) Field of Classification Search
CPC ..................................................... G01R 31/362
USPC .......... 320/127, 132, 135, 136; 324/426, 433, 324/434; 702/60, 61, 63, 64; 713/340
See application file for complete search history.

(56) References Cited

U.S. PATENT DOCUMENTS

| | | | |
|---|---|---|---|
| 5,640,081 A * | 6/1997 | Austin | G01R 31/361 320/127 |
| 5,903,131 A | 5/1999 | Sekine et al. | |
| 6,313,832 B1 | 11/2001 | Ishida | |
| 6,864,665 B2 * | 3/2005 | Yoshida | G06F 1/3203 320/132 |
| 7,681,054 B2 * | 3/2010 | Ghiasi | G06F 1/3203 320/127 |
| 2002/0011820 A1 | 1/2002 | Suzuki et al. | |
| 2010/0286938 A1 | 11/2010 | Kaneko | |

FOREIGN PATENT DOCUMENTS

| | | |
|---|---|---|
| EP | 1 975 636 A2 | 10/2008 |
| JP | 2002-010511 A | 1/2002 |
| JP | 2007-244058 A | 9/2007 |
| JP | 2009-232671 A | 10/2009 |
| JP | 2010-081692 A | 4/2010 |

\* cited by examiner

*Primary Examiner* — Richard V Muralidar
(74) *Attorney, Agent, or Firm* — Foley & Lardner LLP (57) ABSTRACT

In battery cell control system and method, a monitoring section connected to a battery cell included in an assembled battery, operated with the battery cell as a power source, and configured to monitor a state of the battery cell is provided and a first consumption of the battery cell which is consumed by the monitoring section in accordance with a voltage of the battery cell is estimated using the voltage of the battery cell.

11 Claims, 6 Drawing Sheets

BATTERY CELL CONTROL SYSTEM AND METHOD

TECHNICAL FIELD

The present invention relates to battery cell control system and method.

BACKGROUND ART

A Japanese Patent Application First Publication (tokkai) 2007-244058 published on Sep. 20, 2007 exemplifies a previously proposed capacity adjustment system which performs capacity adjustments between a plurality of battery cells constituting an assembled battery. In such a previously proposed capacity adjustment system as described above, a difference in a consumed current between a plurality of current consumption devices, each current consumption device operated with a voltage of a particular battery cell as a voltage source, is calculated in accordance with a presence or absence of a photo-coupler constituting a corresponding one of the current consumption devices and one or more of the cells are discharged to adjust the capacity of the corresponding one or more of the cells on a basis of the difference in the consumed current described above.

DISCLOSURE OF INVENTION

However, in the previously proposed capacity adjustment system described above, the difference in the consumed current between the current consumption devices is developed due to any factors other than the presence or absence of the photo-coupler. Hence, there is a high possibility that a sufficient calculation accuracy for the calculation based on the difference in the consumed current cannot be achieved.

It is, hence, an object of the present invention to provide battery cell control system and method which are capable of accurately calculating a consumption (a power consumption (quantity)) in a monitoring section which is operated with a plurality of connected battery cells as a power source.

The present invention solves the above-described task by estimating a first consumption of a battery cell (which is included in an assembled battery) consumed by the monitoring section in accordance with a voltage of the battery cell. According to the present invention, since the consumption in the monitoring section is estimated in accordance with the voltage of the cell which provides the power source of the monitoring section, the consumption can accurately be estimated even in a case where the consumption is varied according to the voltage of the cell.

That is to say, according to one aspect of the present invention, there is provided a battery cell control system comprising: a monitoring section connected to a battery cell included in an assembled battery, operated with the battery cell as a power source, and configured to monitor a state of the battery cell; and an estimation section configured to estimate a first consumption of the battery cell which is consumed by the monitoring section in accordance with a voltage of the battery cell using the voltage of the battery cell.

According to another aspect of the present invention, there is provided a battery cell control apparatus comprising: monitoring means connected to a battery cell included in an assembled battery and operated with the battery cell as a power source for monitoring a state of the battery cell; and estimation means for estimating a first consumption of the battery cell which is consumed by the monitoring means in accordance with a voltage of the battery cell using the voltage of the battery cell.

According to a still another aspect of the present invention, there is provided a battery cell control method comprising: providing a monitoring section connected to a battery cell included in an assembled battery, operated with the battery cell as a power source, and configured to monitor a state of the battery cell; and estimating a first consumption of the battery cell which is consumed by the monitoring section in accordance with a voltage of the battery cell using the voltage of the battery cell.

DESCRIPTION OF EMBODIMENTS

Reference will, hereinafter, be made to the drawings in order to facilitate better understanding of the present invention.

Embodiment 1

Figure 1:
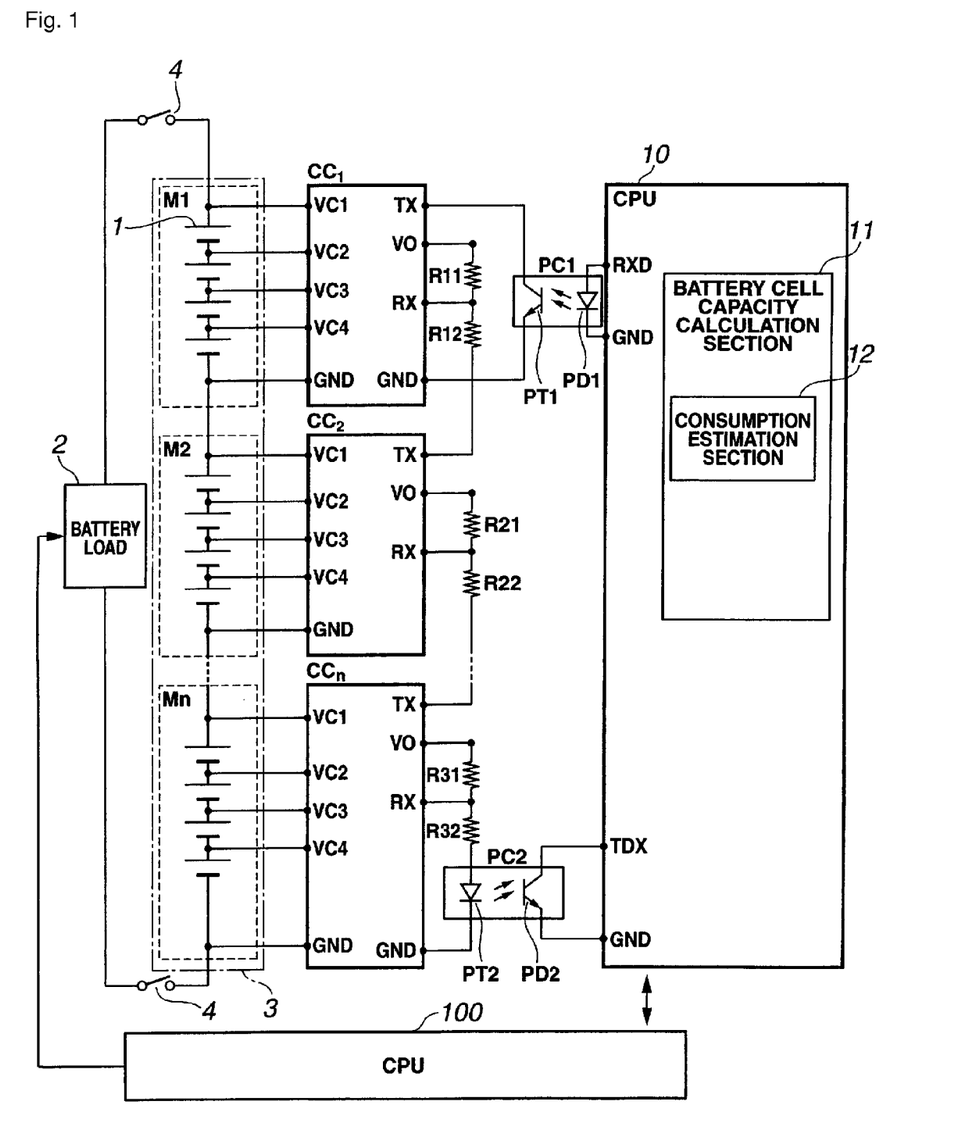
FIG. 1 is a circuit block diagram of a battery cell control system in a preferred embodiment according to the present invention.
Figure 2:
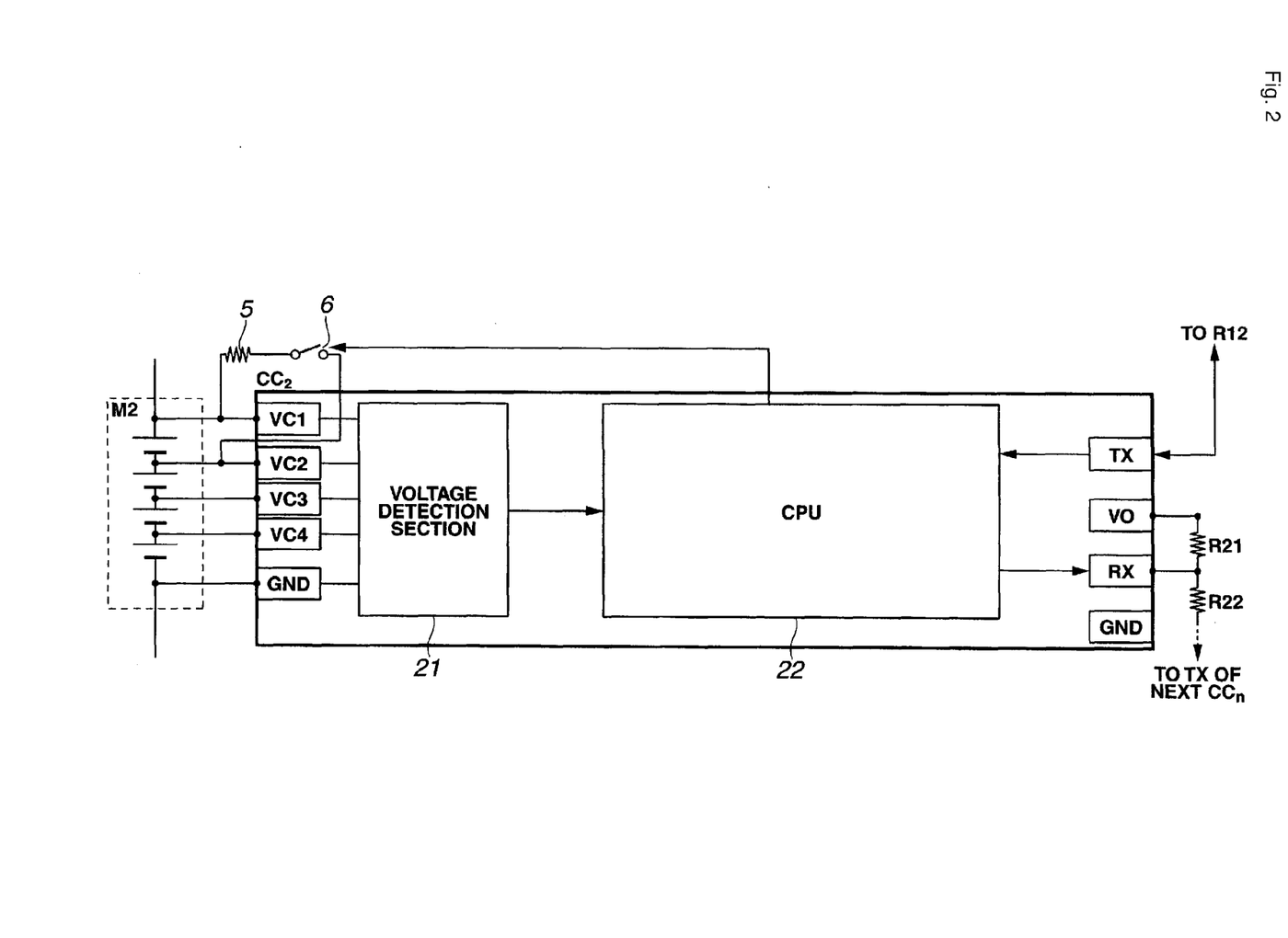
FIG. 2 is a circuit block diagram representing a cell controller CC2 shown in FIG. 1.

FIG. 1 is a circuit block diagram representing a battery cell control system in a preferred embodiment according to the present invention and FIG. 2 is a detailed block diagram representing a cell controller CC2 shown in FIG. 1.

The battery cell control system in the preferred embodiment according to the present invention includes: cell modules M1, M2, - - - , Mn (n denotes an arbitrary positive integer) with a battery cell 1 of a serially connected m number (m denotes an arbitrary positive integer and, in an example of FIG. 1, m=4) of battery cells 1 as a unit; and an n number of cell controllers CC1, CC2, - - - , CCn monitoring a battery cell capacity (specifically, voltages VC1 through VC4 of respective unit cells) of battery cell modules M1, M2, - - - , Mn). An assembled battery 3 includes battery cell modules M1, M2, - - - , Mn. Each of battery cell modules M1, M2, - - - , Mn is connected to the corresponding one of cell controllers CC1, CC2, - - - , CCn.

The n number of battery cell modules M1 through Mn are serially connected together and a battery load 2 which is an electric motor such as in an electric vehicle is connected to both ends of cell modules M1 through Mn via a power converting device such as an inverter (not shown). A relay switch 4 is connected between assembled battery (or battery pack) 3 and battery load 2. A battery controller 10 is connected to cell controllers CC1, CC2, - - - , CCn via a photo-coupler PC1 and so forth.

Each of cell controllers CC1, CC2, - - - , CCn detects and stores voltages of (or across) individual battery cells 1 connected to the corresponding one of cell controllers CC1, CC2, - - -, CCn and transmits the detected voltages to battery controller 10. In addition, each of cell controllers CC1, CC2, - - -, CCn adjusts a cell capacity of each of battery cells 1 connected thereto on a basis of a signal from battery controller 10. Each of cell controllers CC1, CC2, - - -, CCn is operated in response to a power supply from battery cells 1 connected thereto. That is to say, each of cell controllers CC1, CC2, - - -, CCn provides battery cells 1 connected thereto as a power source thereof. It should be noted that, for the adjustment of the cell capacity, a detailed description thereof will, hereinbelow, be made.

Battery controller 10 is a control section to control each of battery cells 1 and includes a battery cell capacity calculation section 11 and a power consumption estimation section 12. Battery cell capacity calculation section 11 calculates a cell capacity of each of battery cells 1 using a detected voltage across each of battery cells 1 transmitted from each of cell controllers CC1, CC2, - - -, CCn. Consumption estimation section 12 calculates a consumption of each of battery cells 1 connected to each of cell controllers CC1, CC2, - - -, CCn. Battery controller 10 manages a state of each of battery cells 1 via cell controllers CC1, CC2, - - -, CCn and transmits a command signal to detect a voltage of each of battery cells 1 and a control signal such as to adjust a capacity of each of battery cells 1 to cell controllers CC1, CC2, - - -, CCn. In addition, battery controller 10 reads a detected voltage of each of battery cells 1 from cell controllers CC1, CC2, - - -, CCn and calculates a state of charge (SOC) of each of battery cells 1 connected to the corresponding one of cell controllers CC1, CC2, - - -, CCn, adding an information on a detected current from a current sensor (not shown) connected to assembled battery 3. It should be noted that a calculation method of the battery cell capacity of each of battery cells 1 will, hereinafter, be described.

A photo-coupler PC1 and photo-coupler PC2 are connected between battery controller 10 and first and last cell controllers CC1, CCn. A communication between battery controller 10 and cell controllers CC1, CC2, - - -, CCn is carried out via these photo-couplers PC1, PC2. Photo-coupler PC1 includes: a transmission side photo-diode PD1 connected to battery controller 10; and a reception side phototransistor PT1 connected to cell controller CC1. On the other hand, photo-coupler PC2 includes: a reception side photodiode PD2 connected to battery controller 10; and a transmission side photo-transistor PT2 connected to last cell controller CCn. Then, communication wirings are carried out between each of cell controllers CC1 through CCn via resistors R11, R12, R21, R22, R31, and R33 connected between each of cell controllers CC1, CC2, - - -, CCn. That is to say, an electrical isolation between battery controller 10 and cell controllers CC1, CC2, - - -, CCn is made and cell controllers CC1, CC2, - - -, CCn are connected in cascade connection. Then, a signal is transmitted from battery controller 10 to cell controller CC1 via photo-coupler PC1. This signal is transmitted from first cell controller CC1 sequentially to last cell controller CCn and battery controller 10 receives the signal transmitted from last cell controller CCn. Thus, the communication between battery controller 10 and cell controllers CC1 through CCn is established and is carried out.

When an electric power is supplied from n number of battery cell modulus M1 through Mn to battery load 2, dispersions of the battery cell capacities due to productive individual differences in respective battery cells 1 from a manufacturing point of view are found. Therefore, a command is transmitted from battery controller 10 to each of cell controllers CC1, CC2, - - -, CCn to close a switching element 6 and the electric power of any one or more of battery cells 1 which are relatively high in battery cell capacity is supplied to a capacity adjustment resistor 5 (refer to FIG. 2). Thus, the battery cell capacity can be adjusted at a predetermined timing.

A control section 100 controls an ON/OFF operation of relay switch (relay switches) 4 and performs a control over a whole vehicle including battery load 2 according to a state of assembled battery 3 on a basis of the signal from battery controller 10. Control section 100 places a limitation on an output torque of the motor (battery load 2) through the control over the inverter to prevent an excessive discharge of corresponding battery cell 1, in a case where there is a high possibility that the excessive discharge in assembled battery 3 occurs.

FIG. 2 shows an internal structure of (second) cell controller CC2. It should be noted that a basic structure of each of other cell controllers CC1, CCn than second cell controller CC2 is the same as that of second cell controller CC2 but a difference point is that photo-couplers PC1 and PC2 are respectively connected to cell controllers CC1 and CCn.

Second cell controller CC2 includes input terminals of VC1 through VC4 through which voltages of respective battery cells 1 of corresponding battery cell module M2 constituted by four battery cells 1 are inputted thereinto, a ground terminal GND thereof, a voltage detection section 21, and a CPU (Central Processing Unit) 22. Voltage detection section 21 detects and holds a voltage value inputted to each of input terminals VC1 through VC4 and transmits the voltage value information to CPU 22. CPU 22 receives a signal from first cell controller CC1 and transmits the signal to adjacent third cell controller CC3. The signal transmitted from first cell controller CC1 is the signal transmitted from battery controller 10 and second cell controller CC2 performs the detection of voltage of each battery cell 1 in module M2 by means of voltage detection section 21 and performs an adjustment of the battery cell capacity according to an ON/OFF control of switching element 6 as will be described later. Furthermore, second cell controller CC2 transmits the signal to next cell controller CCn (namely, third cell controller CC3 which is adjacent to second cell controller CC2) upon a write of a data on the detected voltages by means of voltage detection circuit 21 onto the signal.

In addition, capacity adjustment resistor 5 and switching element 6, both of which being serially connected together, are connected to both terminals of each of battery cells 1. Switching element 6 (on/off control) is controlled by means of CPU 22. When switching element 6 is turned to ON state, a current is caused to flow from the corresponding one of battery cells 1 to connected capacity adjustment resistor 5 so that the capacity of the corresponding one of battery cells 1 is adjusted and a voltage across the corresponding one of battery cells 1 is dropped.

Thus, the electric power of the corresponding one of battery cells 1 whose capacity is higher than any other battery cells 1 is consumed into capacity adjustment resistor 5. A function to drop the output voltage of each of battery cells 1 is provided with corresponding capacity adjusting resistor 5 and switching element 6.

It should be noted that capacity adjustment resistor 5 and switching element 6 are also connected to each of battery cells 1 other than one of battery cells 1 which is placed at an uppermost stage (of second battery cell module M2). In FIG. 2, capacity adjustment resistor 5 and switching element 6 to be connected to battery cell 1 placed at the uppermost stage of corresponding battery cell module (in FIG. 2, M2) are depicted but other capacity adjustment resistor 5 and switching element 6 are not omitted therein. In FIG. 1, the description of capacity adjustment resistor 5 and switching element 6 has been omitted. In addition, for any other cell controllers CC1, CCn than second cell controller CC2, capacity adjustment resistor 5 and switching element 6 are similarly connected across both terminals of each of battery cells 1.

Next, the communication between battery controller 10 and each of cell controllers CC1, CC2, - - -, CCn will, herein, be explained. The signal transmitted from battery controller 10 stores an address allocated to each of individual cell controllers CC1, CC2, - - -, CCn and an address allocated to each of battery cells 1. In addition, for example, CPU 22 of second cell controller CC2 determines whether the received signal includes the address of cell controller CC2 itself and the address of each of battery cells 1 connected to second cell controller CC2.

Then, if the received signal includes the corresponding addresses, a predetermined control is performed on a basis of a control command included in the received signal. In a case where the control command includes a command to the effect that, for example, the capacity adjustment should be performed, CPU 22 identifies one or more of battery cells 1 which are to be capacity adjusted on a basis of the address and controls switching element 6 or switching elements 6 connected to one or more of battery cells 1 to be capacity adjusted. A time duration during which corresponding switching element 6 is turned to ON is included in the signal transmitted from battery controller 10. Then, CPU 22 turns on corresponding switching element 6 during the time duration. Consequently, CPU 22 performs the capacity adjustment for identified (or particular) battery cell or battery cells 1.

Figure 3:
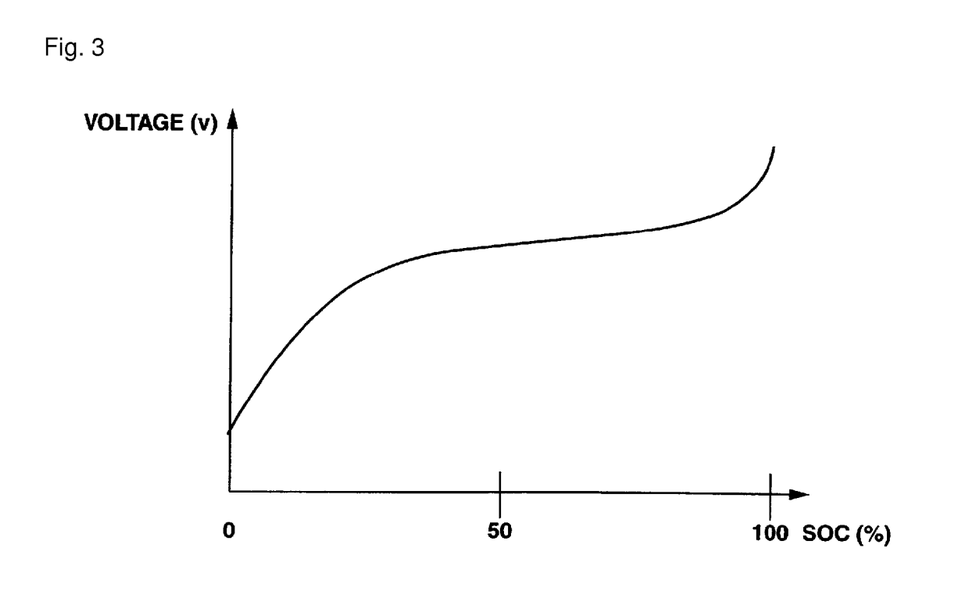
FIG. 3 is a graph representing a characteristic of SOC with respect to a detected voltage (v) of each of battery cells shown in FIG. 1.
Figure 4:
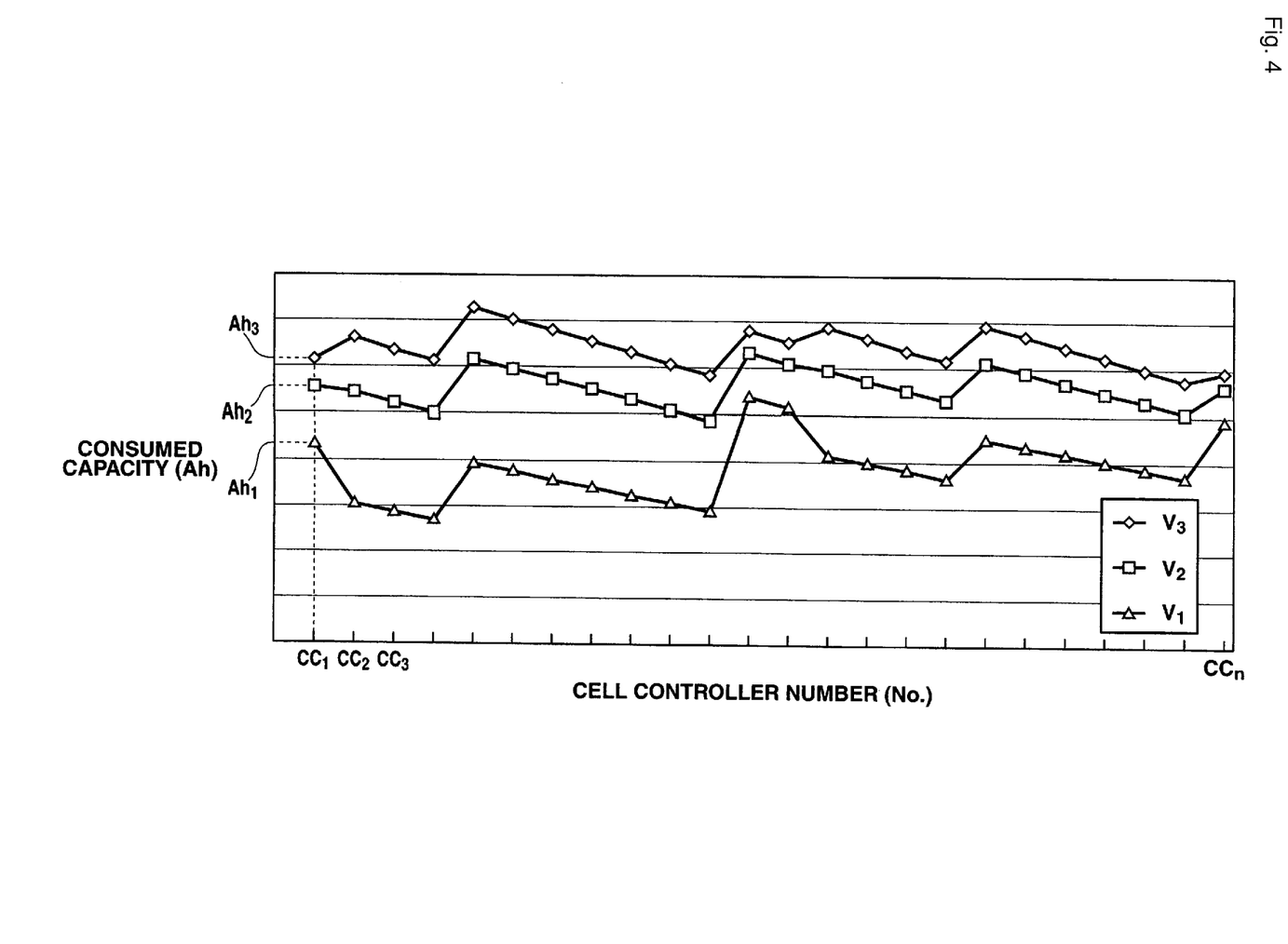
FIG. 4 is a graph representing a characteristic of a consumed capacity with respect to each of cell controllers shown in FIG. 1.

Next, a method of making the battery capacity adjustment in the battery cell control apparatus in the preferred embodiment will be described using FIGS. 3 through 6. FIG. 3 shows a characteristic graph representing a voltage (V) with respect to an SOC (State Of Charge: %) of battery cell 1 and FIG. 4 shows a consumption capacity (Ah) with respect to each of cell controllers CC1, CC2, CC3, - - -, CCn. It should be noted that the number of cell controllers are allocated to as one of cell controllers CC1 located at the uppermost stage is the first cell controller and as last one of cell controllers CCn located at a lowermost stage is n-th number cell controller.

First, a method for calculating cell capacities of respective battery cells 1 (a remaining capacity of each of battery cells 1) will herein be described.

Each of cell controllers CC1 through CCn detects the (terminal) voltage of each of cells 1 connected thereto at a predetermined sampling period. The detection of voltage of each of battery cells 1 described above is started at least before a load is applied to assembled battery 3 and each of cell controllers CC1 through CCn detects the voltage at a time of no load application to each of battery cells 1 connected thereto.

It is known that a predetermined relationship between the (terminal) voltage at a time of no application of load to a representative cell 1 and the charged state (hereinafter, referred to as SOC(%)) of representative cell 1 is established, as shown in FIG. 3. Therefore, battery controller 10 stores the relationship shown in FIG. 3 as a table representing a correspondence between the detected voltage of each of battery cells 1 and its SOC thereof, detects the voltage at the time of no load of each of battery cells 1, and derives SOC corresponding to the detected voltage in response to the control signal transmitted from cell controller CCn. A battery cell capacity ($Ah_m$) at a time of full charge of representative battery cell 1 is predetermined according to a characteristic of the cell used. Hence, a cell capacity ($Ah_0$) of each of battery cells 1 at the time of the voltage detection thereof is derived from the following equation (Equation 1).

$$Ah_0 = SOC(\%) \times Ah_m \quad \text{(Equation 1)}$$

It should be noted that, since cell capacity ($Ah_m$) at a time of full charge is varied according to an aging (deterioration) of corresponding cell 1, cell capacity ($Ah_m$) may be determined by adding a degree of deterioration to a fully charged capacity of cell 1 at an initial stage.

Next, present battery cell capacity ($Ah_t$) of each battery cell 1 will be described below. Battery cell capacity ($Ah_t$) is varied by driving battery cell load 2. In this embodiment, since representative battery cell 1 provides a power supply for each of cell controllers CC1 through CCn, cell controllers CC1 through CCn are driven so that the capacity consumed by driving cell controllers CC1 through CCn needs to be reflected on the calculation of the capacity.

It should, herein, be noted that a consumed capacity ($Ah_c$) consumed by each of battery cells 1 by driving cell controllers CC1 through CCn will be described with reference to FIG. 4. The consumed capacity ($Ah_c$) in each of cell controllers CC1 through CCn is different according to the voltage of representative battery cell 1 which provides the power supply for the corresponding one of cell controllers CC1 through CCn and is different even from among respective cell controllers CC1 through CCn. For example, for first cell controller CC1, the consumed capacity indicates $Ah_1$ in a case where the detected voltage of a plurality of battery cells 1 to be connected to first cell controller CC1 is $V_1$, the consumed capacity indicates $Ah_2$ in a case where the detected voltage thereof is $V_2$, and the consumed capacity indicates $Ah_3$ in a case where detected voltage thereof is $V_3$. It should be noted that, if $V_1 < V_2 < V_3$, $Ah_1 < Ah_2 < Ah_3$. Then, consumed capacity ($Ah_c$) is different according to the detected voltage of a plurality of battery cells 1 to be connected. That is to say, for other cell controllers CC2 through CCn, the consumed capacity ($Ah_c$) is different according to the detected voltage of a plurality of cells 1 to be connected to the corresponding one of other cell controllers CC2 through CCn. That is to say, the detected voltage of each of cells 1 to be connected to the corresponding one of cell controllers CC1 through CCn and the consumed capacity ($Ah_c$) establish a relationship previously determined at the stage of design, as shown in FIG. 4. Therefore, in this embodiment, the consumed capacity ($Ah_c$) for the detected voltage is preset for each of cell controllers CC1 through CCn. It should be noted that, in this embodiment, a time component of the consumed capacity (Ah) shown in FIG. 4 corresponds to the sampling period. For example, in a case where, for first cell controller CC1, voltage of the plurality of battery cells 1 connected to cell controller CC1 is $V_1$, corresponding battery cells 1 consume capacity ($Ah_1$) during the sampling period.

In this embodiment, battery controller 10 stores the relationship shown in FIG. 4 as a table representing the correspondence between the detected voltage of battery cell 1 and consumed capacity ($Ah_c$) for each of cell controllers CC1 through CCn. Then, battery controller 10 detects the voltage of each cell 1 in response to the control signal transmitted from cell controller CCn. Consumed capacity estimation section 12 refers to the table to estimate consumed capacity ($Ah_c$) corresponding to the detected voltage in each of cell controllers CC1 through CCn.

Communication purpose resistors R11, R12, R31 and photo-couplers PC1, PC2 are connected to first and last cell controllers CC1 and CCn. Communication purpose resistors R21, R22 are connected to each of other cell controllers CC2 through CCn−1. Therefore, when battery cell capacity ($Ah_t$)

of representative battery cell 1 is calculated, it is recommended that the consumption according to a circuit structure connected to the respective cell controllers such as photocouplers PC1, PC2 and communication purpose resistors R11, R12, R21, R22, R31, R32, and so forth may be added when battery cell capacity ($Ah_t$) of representative battery cell 1 is calculated.

A consumed capacity ($Ah_p$) of representative battery cell 1 consumed according to the circuit structure connected to each of cell controllers is determined according to a circuit component used and is preset for each of cell controllers CC1 through CCn.

In this embodiment, the capacity adjustment causes representative battery cell 1 to be discharged. Hence, the battery cell consumption is preferably reflected on the capacity calculation. Consumed capacity ($Ah_a$) of representative battery cell 1 according to the capacity adjustment is determined according to the on duration of switching element 6 connected to each battery cell 1 and a resistance value of switching element 6 connected to representative battery cell 1 by means of battery controller 10 in accordance with the dispersion of each of battery cells 1. It should be noted that a specific method of the capacity adjustment will be described later.

In addition, present battery cell capacity ($Ah_t$) after battery cell capacity ($Ah_O$) is derived, in other words, battery cell capacity ($Ah_t$) upon a lapse of time corresponding to the sampling period after voltage of representative battery cell 1 at an initial no-load application is derived from the following equation (Equation 2).

$$Ah_t = Ah_O - Ah_c - Ah_p - Ah_a \quad \text{(Equation 2)}$$

In other words, battery controller 10 detects the voltage of representative battery cell 1 at the time of no load application in response to the signal from each of cell controllers CC1 through CCn and battery cell capacity calculation section 11 calculates battery cell capacity ($Ah_O$) of each of battery cells 1 according to the detected voltage by means of batter cell capacity calculation section 11. Battery controller 10 detects the voltage to be detected at the next period, estimates consumed capacity (Ahc) from the detected voltage through consumption estimation section 12, and calculates present battery cell capacity ($Ah_t$) on a basis of above-described equation (2).

Next, the method of the capacity adjustment of each of battery cells 1 using battery cell capacity ($Ah_t$) calculated by battery controller 10 will be described below.

As described above, battery cell capacity ($Ah_t$) of each of battery cells 1 included in assembled battery 3 is calculated through battery capacity calculation section 11 and consumption estimation section 12. Battery controller 10 identifies one of battery cells 1 which is smallest (lowest) in the battery cell capacity from among battery cell capacities ($Ah_t$) of respective battery cells 1 included in assembled battery 3. Then, a capacity difference between battery cell capacity ($Ah_t$) of identified battery cell 1 and battery cell capacity ($Ah_t$) of each of other battery cells 1 is calculated and compared with a predetermined threshold value.

It should be noted that the predetermined threshold value corresponds to a magnitude of the dispersion in capacities and such a threshold value is preset that a dispersion condition becomes more strict by reducing the threshold value and the dispersion condition becomes loose by enlarging the threshold value. In this embodiment, the predetermined threshold value is fixedly preset but this threshold value may be varied arbitrarily.

In a case where the difference between the cell capacities is larger than the predetermined threshold value, battery controller 10 determines that the dispersion described above is large and identifies one or more of battery cells 1 which are to be capacity adjusted. An adjustment quantity of the capacity is adjusted according to a discharge time of each of battery cells 1. Hence, battery controller 10 turns on switching element 6 by a time duration corresponding to the time duration of the capacity adjustment so that one of battery cells 1 which is relatively large in the dispersion is discharged. The time duration during which switching element 6 is turned on is calculated using the difference between the capacity of one of battery cells 1 to be adjusted and the capacity of one of battery cells 1 which is lowest in the battery cell capacity and resistance value of capacity adjustment resistor 5. As described above, battery controller 10 identifies one or more of battery cells 1 to be capacity adjusted by a comparison between battery cell capacity ($Ah_t$) calculated by battery cell capacity calculation section 11 and predetermined threshold value, sets the time duration during which corresponding switching element 6 is turned on, and turns on the corresponding switching element 6 during the set time duration. Thus, this causes the battery cell capacity of each of battery cells 1 in which the dispersion is large enough to be adjusted to eliminate the dispersions of respective battery cells 1.

It should be noted that, in this embodiment, the battery cell capacity adjustment is carried out in accordance with the difference in battery cell capacity from one of the battery cells whose battery cell capacity is lowest. For example, with an average value of battery cell capacities of battery cells 1 as a reference, the capacity of one or more of battery cells 1 which are higher than the average value may be adjusted. In addition, the capacity adjustment may be made using the well known method.

Figure 5:
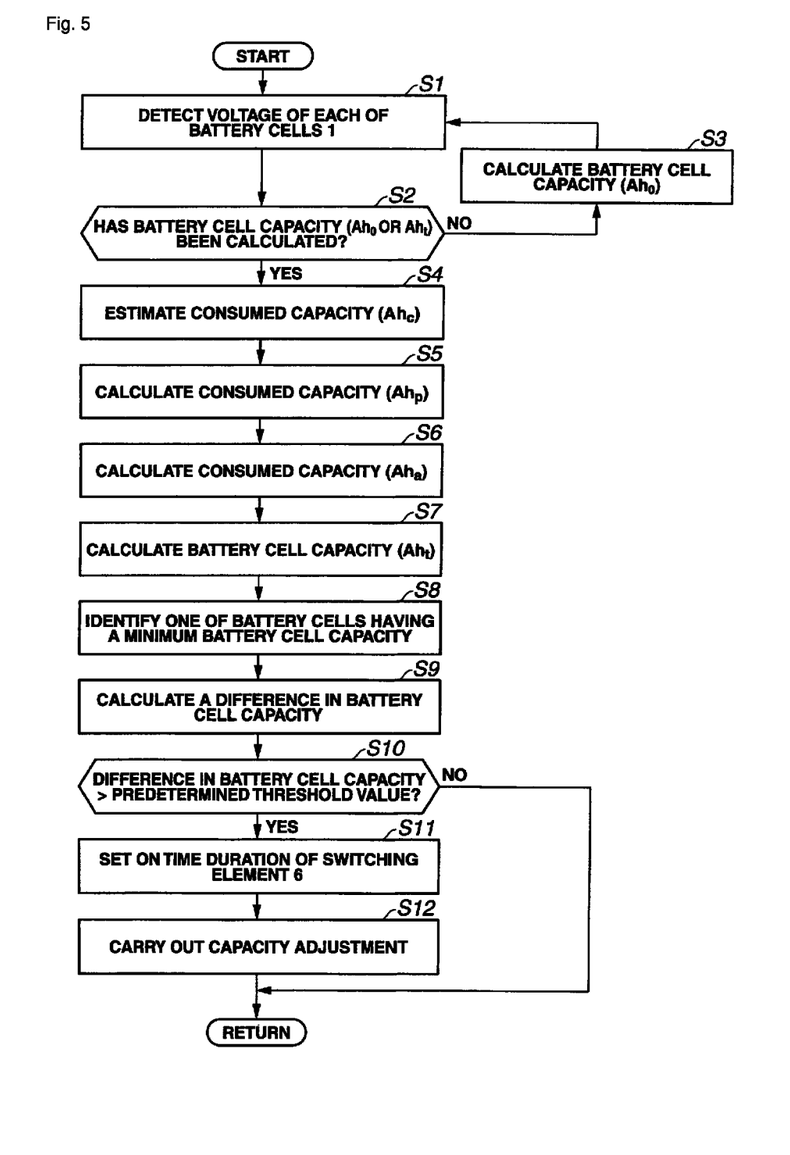
FIG. 5 is a flowchart representing a control procedure of the battery cell control system shown in FIG. 1.

Next, a control procedure of the battery cell control system in this embodiment will be described below with reference to FIG. 5. FIG. 5 shows a flowchart representing the control procedure of the battery cell control system in this embodiment.

That is to say, at a step S1, battery controller 10 transmits the control signal to cell controllers CC1 through CCn to detect the voltage of each of battery cells 1. At a step S2, battery controller 10 determines whether battery cell capacity ($Ah_O$) of each of battery cells 1 or battery cell capacity ($Ah_t$) of each of battery cells 1 has been calculated. For example, in a case where, in a state of no-load application, the voltage of one of battery cells 1 has initially been detected, battery cell capacity ($Ah_O$) is not yet calculated by battery cell capacity calculation section 11 and the battery cell capacity ($Ah_t$) is not yet calculated at a step S7 as will be described later. Hence, the routine goes from step S1 to a step S3. At step S3, battery cell capacity calculation section 11 refers to the above-described table representing the correspondence between the detected voltage and SOC, the table corresponding to FIG. 3 and, using the detected voltage detected at step S1, calculates battery cell capacity ($Ah_m$) of each of battery cells 1, and calculates battery cell capacity ($Ah_O$) of each of battery cells 1 using equation (1) (Equation (1)). Then, the routine returns to step S1.

On the other hand, if, at step S2, battery cell capacity ($Ah_O$) or battery cell capacity ($Ah_t$) has been calculated (Yes), the routine goes to a step S4. Then, at step S4, consumption estimation section (means) 12 refers to the table representing the correspondence between the detected voltage and the consumed capacity ($Ah_c$) of each of cell controllers CC1 through CCn which corresponds to FIG. 4 to estimate consumed capacity ($Ah_c$) of each of cell controllers CC1 through CCn in accordance with the detected voltage of the corresponding one of battery cells 1 using the corresponding voltage detected at step S1. At a step S5, battery controller 10 calculates consumed capacity ($Ah_p$) at battery cell capacity calculation section 11. As described above, consumed capacity ($Ah_p$) is preset for each of cell controllers CC1 through CCn. Consumed capacity ($Ah_p$) is a consumed capacity determined according to the communication in each of cell controllers CC1 through CCn during the sampling period of step S1. It should be noted that, in a case where a total voltage sensor, a current sensor, and so forth (not shown) are connected to each of cell controllers CC1 through CCn and these sensors are driven by the electric power of each of battery cells 1, the power consumption by the drive of these sensors is included in consumed capacity ($Ah_p$).

At a step S6, battery cell capacity calculation section 11 of battery controller 10 calculates consumed capacity ($Ah_a$). Consumed capacity ($Ah_a$) corresponds to the discharged capacity of each of battery cells 1 according to the capacity adjustment and is set, at a step S11 as will be described later, using the on duration of switching element 6 and the resistance value of capacity adjustment resistor 5. At a step S7, battery cell capacity ($Ah_t$) of each of battery cells 1 which is a minimum of the battery cell capacity using equation (2) (Equation 2) described above.

Next, battery controller 10, at a step S8, identifies battery cell 1 having a smallest (minimum or lowest) battery cell capacity from the battery cell capacities ($Ah_t$) of each of battery cells 1. At a step S9, battery controller 10 calculates the difference in the capacity of each of battery cells 1 with respect to the cell capacity of the one of the cells 1 which is identified at step S8. At a step S10, battery controller 10 compares the difference in the battery cell capacity at step S9 with the (preset) predetermined threshold value. If the difference in the battery cell capacity is larger than the preset threshold value (Yes) at step S10, processes at steps S11 and S12 are carried out. If the difference in the battery cell capacity is equal to or smaller than the predetermined threshold value (No) at step S10, the control process is ended.

At step S11, battery controller 10 sets the on time duration of corresponding switching element 6 according to the difference in the battery cell capacity through step S10. Battery controller 10, at step S12, transmits the control signal to the effect that the capacity adjustment should be made to each of cell controllers CC1 through CCn upon the correspondence between the address of battery cell 1 which is to be capacity adjusted and the on time duration. Each of cell controllers CC1 through CCn which has received the control signal analyzes the control signal. The capacity adjustment is made with switching element 6 turned on in response to the command from battery controller 10. Then, if the above-described series of processing is ended for all of battery cells 1, the routine is returned again to step S1.

Next, a capacity variation of each of battery cells 1 in the battery cell control system in the preferred embodiment will be explained with reference to FIG. 6.

Figure 6:
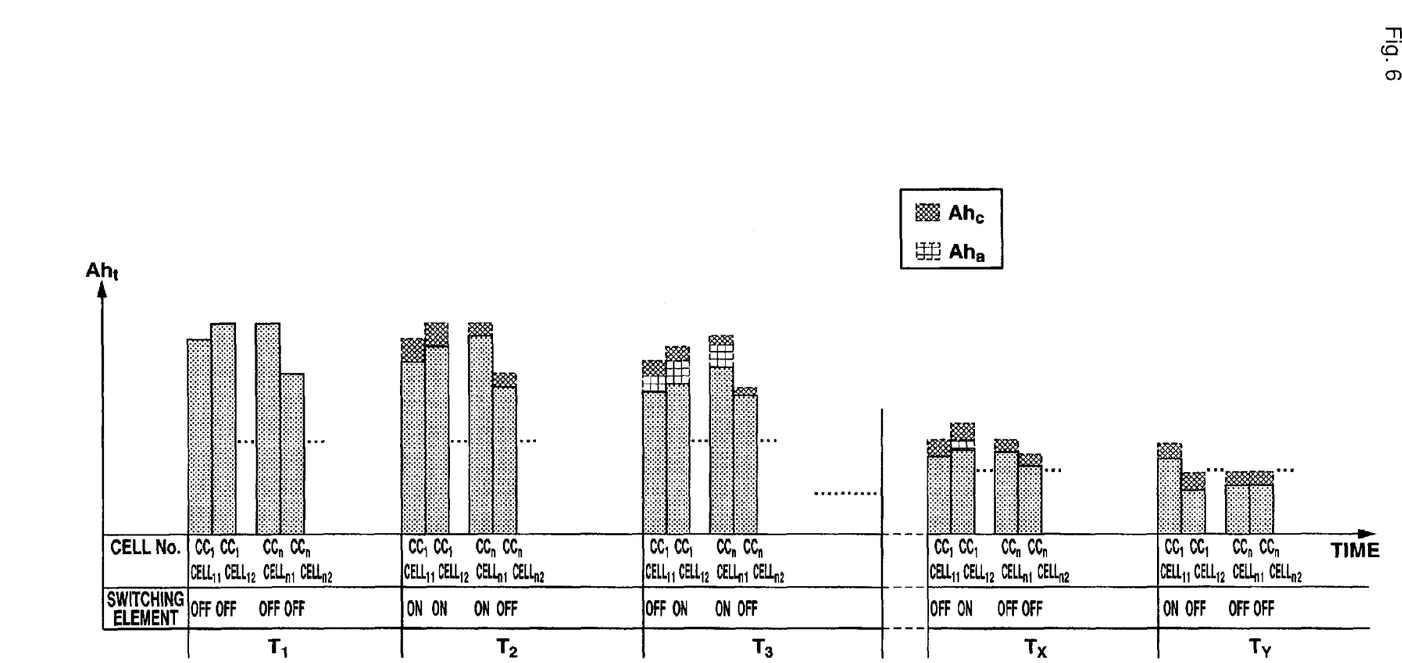
FIG. 6 is a graph for explaining variations in capacities of the battery cells shown in FIG. 1.

FIG. 6 shows the characteristic of the battery cell capacity for each of battery cells 1 and indicates the variation in the battery cell capacity along with the timing of the voltage detection. FIG. 6 shows battery cell capacity at the time of sampling of the detected voltage in each of cell controllers CC1 through CCn. It should be noted that $cell_{11}$ denotes one of battery cells 1 which is located at the uppermost stage to be connected to first cell controller CC1, $cell_{12}$ denotes the second one of battery cells 1 located at the second uppermost stage to be connected to first cell controller CC1, $cell_{n1}$ denotes one of battery cells 1 located at the uppermost stage to be connected to last cell controller CCn, and $cell_{n2}$ denotes the second one of battery cells 1 located at the second uppermost stage to be connected to last cell controller CCn.

For the timing at which at which detection of each of battery cells 1 is carried out, $T_1$ denotes a timing at which the detection for each of battery cells 1 is at first made, $T_2$ denotes a timing at which the detection for each of battery cells 1 is secondly made after the elapse of sampling period from timing $T_1$, $T_3$ denotes a timing at which the detection for each of battery cells 1 after the lapse of the sampling period from timing $T_1$. $T_X$ denotes a timing after timing $T_3$ and denotes a predetermined detection timing, TY denotes a predetermined detection timing after $T_X$. It should be noted that subscripts X and Y denote natural numbers.

Then, a lateral axis of FIG. 6 denotes an on or off state of each switching elements 6 and cells $cell_{11}$ through $cell_{nn}$ and a longitudinal axis of FIG. 6 denotes battery cell capacity (Aht) which is the remaining capacity of each of battery cells 1. It should be noted that a decreasing quantity corresponding to consumed capacity ($Ah_p$) is omitted.

Battery cell 1 to be detected at a time $T_1$ shown in FIG. 6 is under the no-load state. However, as shown in FIG. 6, battery cell capacities of respective battery cells 1 have the dispersions to some degree due to the aging effect (deterioration) of the individual battery cells 1.

Then, the battery cell capacities are consumed in accordance with the voltages of battery cells 1 to be connected to respective cell controllers CC1 through CCn. The consumption consumed in accordance with the detected voltages correspond to consumed capacities ($Ah_c$). Since the same capacities and the same consumption are made between respective cells 1 connected to the same controllers CC1 through CCn, the consumed capacities ($Ah_c$) of $cells_{11}$ and $cells_{12}$ are mutually the same. As shown in FIG. 4, consumed capacity ($Ah_c$) is different for each of cell controllers CC1 through CCn. In FIG. 6, consumed capacity ($Ah_c$) at a time of $T_2$ is different between cell controller CC1 and cell controller CCn. That is to say, battery controller 10 calculates consumed capacity ($Ah_c$) consumed from time $T_1$ to time $T_2$ from the detected voltage of each battery cell 1 detected at time $T_2$. Then, battery controller 10 subtracts consumed capacity ($Ah_c$) from battery cell capacity ($Ah_t$) based on the detected voltage at time $T_2$ to calculate battery cell capacity ($Ah_t$) at time $T_2$. Battery controller 10 identifies one or more of battery cells 1 to be capacity adjusted from battery cell capacity ($Ah_t$) at time $T_2$ and sets the on time duration of corresponding switching element 6. In FIG. 6, since the capacity of $cell_{n2}$ is smallest (lowest), capacities of $cell_{11}$, $cell_{12}$, and $cell_{n1}$ are adjusted to become equal to the capacity of $cell_{n2}$ with the capacity of $cell_{n2}$ as a reference.

Consumed capacity ($Ah_c$) is consumed by respective cell controllers CC1 through CCn from time $T_2$ to time $T_3$. It should herein be noted that, since the detected voltage at time $T_3$ is lower than the detected voltage at time $T_2$, consumed capacity ($Ah_c$) from time $T_2$ to time $T_3$ is smaller than consumed capacity ($Ah_c$) from time $T_1$ to time $T_2$. In addition, since the capacity adjustment is made for one of battery cells 1 which is identified at the time point of time $T_2$ during the time interval from time $T_2$ to time $T_3$, consumed capacity ($Ah_a$) is consumed. That is to say, battery cell capacity ($Ah_t$) of battery cell 1 at time $T_3$ is a capacity of subtraction between consumed capacity ($Ah_c$) during the time interval from time $T_2$ to time $T_3$ and consumed capacity ($Ah_a$) between time interval of time $T_2$ and time $T_3$ from cell capacity ($Ah_t$) of each of battery cells 1 at time $T_2$. Then, one or more of battery cells 1 which are to be capacity adjusted are identified from battery cell capacity ($Ah_t$) at time $T_3$. In FIG. 6, $cell_{n2}$ is one of the battery cells which is smallest (lowest) in battery cell capacity. $Cell_{11}$ is not to be adjusted since the capacity difference thereof from $cell_{n2}$ is small and $cells_{12}$ and $cell_{n1}$ are two of battery cells to be capacity adjusted since they have a large capacity difference from $cell_{n2}$.

Cell capacity ($Ah_c$) at time $T_X$ is a capacity value which is a subtraction of consumed capacity ($Ah_c$) and consumed capacity ($Ah_a$) consumed between battery cell capacity at time $T_{X-1}$ and $T_X$ from the battery cell capacity at time $T_{X-1}$. Since, in FIG. 6, $cell_{n2}$ is the smallest (lowest) capacity cell, $cell_{n2}$ provides a reference battery cell 1 for the capacity adjustment. Since $cell_{11}$ and $cell_{n1}$ have small capacity differences from $cell_{n2}$, they are not battery cells to be capacity adjusted and since $cell_{12}$ has the large capacity difference from $cell_{n2}$, this cell is the battery cell to be capacity adjusted.

Cell capacity ($Ah_c$) at time $T_Y$ is a capacity value which is a subtraction value of consumed capacity ($Ah_c$) and consumed capacity ($Ah_a$) consumed during a time interval from $T_{Y-1}$ to time $T_Y$ from the battery cell capacity at time $T_{Y-1}$. In FIG. 6, $cell_{12}$ is one of battery cells 1 which is smallest (lowest) in capacity, this cell provides the reference battery cell 1 for the capacity adjustment. In addition, $cell_{11}$, $cell_{n1}$, and $cell_{n2}$ are not battery cells to be capacity adjusted since they have small capacity differences for $cell_{12}$.

As described above, in the preferred embodiment, the consumption (corresponding to $Ah_c$) of representative battery cell 1 is estimated which is consumed by cell controllers CC1 through CCn in accordance with the detected voltage of corresponding (representative) battery cell 1. Thus, even in a case where the consumption of the monitoring means (section) according to the voltage of the battery is varied, the above-described consumption can accurately be estimated. Consequently, the control accuracy of each of battery cells 1 can be increased.

In this embodiment, the battery cell capacity of each of battery cells 1 is calculated using the consumption (corresponding to $Ah_c$) and each of battery cells 1 is controlled in accordance with the calculated battery cell capacity. For example, as shown in FIGS. 4 and 6, respective cell controllers CC1 through CCn consume battery cell capacities since battery cells 1 connected to the corresponding cell controllers CC1 through CCn provide power sources for the corresponding cell controllers CC1 through CCn during the sampling period of each of battery cells 1. In this case, the (power) consumption of representative battery cell 1 is varied in accordance with the detected voltage of battery cell 1. Therefore, in this embodiment, the (power) consumption is estimated in accordance with the detected voltage of representative battery cell 1 and the battery cell capacity is calculated. Thereby, in this embodiment, since a remaining capacity of each of battery cells can be grasped with high accuracy so that the control accuracy of battery cells 1 constituting assembled battery 3 can be improved.

In addition, in this embodiment, the capacity adjustment for each of battery cells 1 is made using the battery cell capacity ($Ah_t$) of the corresponding one of battery cells 1 calculated using the (power) consumption (corresponding to $Ah_c$). Thus, since the capacity adjustment is made on a basis of the battery cell capacity on which the consumption (corresponding to $Ah_c$) is reflected, the capacity adjustment can accurately be made and the dispersion described above can be prevented from being developed.

In this embodiment, the battery cell capacity of each of battery cells 1 at a timing of $T_n$ is calculated by subtracting the (power) consumption (corresponding to $Ah_c$) corresponding to the detected voltage detected at a timing of $T_{n-1}$ and the power consumption (corresponding to $Ah_c$) corresponding to the detected voltage detected at timing of $T_n$ from the battery cell capacity calculated at timing of $T_{n-2}$ (n denotes a natural number) and T corresponds to the sampling period. For example, in a case where n=1, T corresponds to $T_1$ in FIG. 6 and T of n=X corresponds to $T_X$). Thus, after time $T_2$, the battery cell capacity ($Ah_t$) is calculated by subtracting the power consumption which accords with the detected voltage without the direct calculation of the battery cell capacity itself of each of battery cells 1. Hence, the calculation load can be reduced. Then, the battery control can be performed with a high accuracy. It should be noted that, in this case, in a case where the capacity adjustment is made during the time interval from $T_{n-2}$ to $T_n$, the calculation of the battery cell capacity may include the power consumption (corresponding to $Ah_a$) and may add the consumption (corresponding to $Ah_p$) to the calculation of the battery cell capacity.

In addition, in this embodiment, the power consumption ($Ah_t$) is calculated using the consumption (corresponding to $Ah_p$) consumed due to the communication of respective cell controllers CC1 through CCn. Consequently, since the consumption of each of battery cells 1 can be reflected on the calculation of the capacity of each of battery cells 1, the calculation accuracy can furthermore be increased.

In addition, in this embodiment, power consumption estimation section 12 of battery controller 12 previously stores the table representing the correspondence between the detected voltage of battery cell 1 and consumed capacity but may estimate the consumed current in accordance with the detected voltage and may estimate the power consumption. In this case, consumption estimation section 12 may store the table representing the correspondence between the detected voltage and the consumed current. Since the consumed capacity ($Ah_c$) corresponds to a multiplication of a consumed current consumed by cell controllers CC1 through CCn in accordance with the detected voltage with the sampling period, consumption estimation section 12 can calculate consumed capacity ($Ah_c$) by estimating the consumed current in accordance with the detected voltage. Then, the consumed current is preset at a design stage in accordance with the detected voltage.

It should be noted that, although consumed capacity ($Ah_c$) at time $T_2$ is, for example, estimated in accordance with the detected voltage at time $T_2$, this may be estimated in accordance with the detected voltage at time $T_1$ or may be estimated in accordance with the variation quantity of the detected voltage from time $T_1$ to time $T_2$. Consumed capacity ($Ah_c$) at time $T_n$ is estimated in accordance with the detected voltage at time $T_n$. However, consumed capacity ($Ah_c$) may be estimated in accordance with the detected voltage at time $T_{n-1}$ or may be estimated in accordance with the variation quantity of the detected voltage at the time interval from time $T_{n-1}$ to $T_n$.

It should be noted that cell controllers CC1 through CCn, in this embodiment, corresponds to "monitoring section (means)" defined in the claims, consumption estimation section 12, in this embodiment, corresponds to "estimation section (means)" defined in the claims, battery cell capacity calculation section 11, in this embodiment, corresponds to "capacity calculation section (means)" defined in the claims, battery controller 10, in this embodiment, corresponds to "control means (section)" defined in the claims, and capacity adjustment resistor 5, in the preferred embodiment, corresponds to "capacity adjustment resistor" defined in the claims. In addition, if the first timing according to the present invention is $T_{n-2}$ in the preferred embodiment, the second timing corresponds to $T_{n-1}$ in the preferred embodiment, and the third timing corresponds to $T_n$ in the preferred embodiment.

If the first timing according to the present invention corresponds to $T_1$ in the preferred embodiment, the second timing corresponds to $T_2$ in the preferred embodiment and the third timing corresponds to $T_3$ in the preferred embodiment.

In addition, consumed capacity ($Ah_c$) in the preferred embodiment corresponds to a first consumption defined in the claims, consumed capacity ($Ah_a$) in the preferred embodiment corresponds to a second consumption defined in the claims, consumed capacity ($Ah_p$) in the preferred embodiment corresponds to a third consumption defined in the claims. It should be noted that the term of "consumption" used in the specification has the same meaning of consumption quantity.

This application is based on a prior Japanese Patent Application No. 2010-128449 filed in Japan on Jun. 4, 2010. Although the invention has been described above by reference to certain embodiments of the invention, the invention is not limited to the embodiment described above. Modifications and variations of the embodiments described above will occur to those skilled in the art in light of the above teachings. The scope of the invention is defined with reference to the following claims.

INDUSTRIAL APPLICABILITY

The battery cell control system and method according to the present invention are applicable to an electrical drive system and method of the load such as the electric motor in an electric vehicle or so forth.

EXPLANATION OF REFERENCE NUMBERS

1 - - - battery cell
M1, M2, - - - , Mn - - - battery cell module
2 - - - battery load
3 - - - assembled battery
4 - - - relay switch
5 - - - capacity adjustment resistor
6 - - - switching element
10 - - - battery controller
11 - - - battery capacity calculation section
12 - - - consumption estimation section
CC1, CC2, CCn - - - cell controller
R11, R12 - - - communication resistor
R21, R22 - - - communication resistor
R31, R32 - - - communication resistor
PC1, PC2 - - - photo-coupler
PD1, PD2 - - - photo-diode
PT1, PT2 - - - photo-transistor
21 - - - Voltage detection section
22 - - - CPU
100 - - - control section

The invention claimed is:

1. A battery cell control system comprising:
a monitoring section connected to a battery cell included in an assembled battery, operated with the battery cell as a power source, and configured to monitor a state of the battery cell; and
an estimation section configured to estimate a first consumption of the battery cell which is consumed by the monitoring section in accordance with a voltage of the battery cell using the voltage of the battery cell.

2. The battery cell control system as claimed in claim 1, wherein the battery cell control system further comprises: a capacity calculation section configured to calculate a capacity of the battery cell using the voltage of the battery cell and the first consumption; and a control section configured to control the assembled battery in accordance with the capacity of the battery cell.

3. The battery cell control system as claimed in claim 2, wherein the monitoring section detects the voltage of the battery cell at a predetermined timing and the capacity calculation section calculates a first battery cell capacity of the battery cell using the voltage of the battery cell detected by the monitoring section at a first timing and calculates a second battery cell capacity of the battery cell by subtracting the first consumption from the first battery cell capacity.

4. The battery cell control system as claimed in claim 3, wherein the estimating section estimates the first consumption using the voltage of the battery cell detected by the monitoring section at a second timing.

5. The battery cell control system as claimed in claim 3, wherein the estimation section estimates a first of the first consumption using the voltage of the battery cell detected by the monitoring section at a second timing and estimates a second of the first consumption using the voltage of the battery cell detected by the monitoring section at a third timing and the capacity calculation section calculates the second capacity of the battery cell by subtracting the first of the first consumption and the second of the first consumption from the first capacity of the battery cell.

6. The battery cell control system as claimed in the claim 3, wherein the monitoring section is constituted by a plurality of monitoring sections connected to a corresponding plurality of battery cells included in the assembled battery and configured to detect voltages of corresponding battery cells, the estimating section estimates the first consumption consumed by each of the monitoring sections using the voltages of the battery cells corresponding to the respective monitoring sections and the capacity calculation section calculates the first battery cell capacity of each of the battery cells corresponding to the respective monitoring sections using the voltages of the respective battery cells detected by the plurality of monitoring sections at the first timing and calculates the second battery cell capacity of each of the battery cells corresponding to the respective monitoring sections by subtracting the first consumption from the first battery cell capacity.

7. The battery cell control system as claimed in claim 6, wherein the control section adjusts the battery cell capacity by discharging the battery cell using the second battery cell capacity.

8. The battery cell control system as claimed in claim 7, wherein the battery cell control system further comprises a capacity adjustment resistor connected to each of the battery cells and wherein the capacity calculation section subtracts a second consumption, consumed when a current is caused to flow from one of the battery cells which is to be capacity adjusted by means of the control section into the capacity adjustment resistor, from the first battery cell capacity to calculate the second battery cell capacity of the battery cell which is to be capacity adjusted.

9. The battery cell control system as claimed in claim 3, wherein the monitoring section is constituted by a plurality of monitoring sections connected to a corresponding plurality of battery cells included in the assembled battery, the control section communicates with at least one of the monitoring sections from among the plurality of monitoring sections, and the capacity calculation section subtracts a third consumption consumed by a communication between the control section and the monitoring section from the first battery cell capacity to calculate the second battery cell capacity of each of the battery cells connected to the corresponding one of the monitoring sections which is communicated with the control section.

10. A battery cell control apparatus comprising:
monitoring means connected to a battery cell included in an assembled battery and operated with the battery cell as a power source for monitoring a state of the battery cell; and
estimation means for estimating a first consumption of the battery cell which is consumed by the monitoring means in accordance with a voltage of the battery cell using the voltage of the battery cell.

11. A battery cell control method comprising:
providing a monitoring section connected to a battery cell included in an assembled battery, operated with the battery cell as a power source, and configured to monitor a state of the battery cell; and
estimating a first consumption of the battery cell which is consumed by the monitoring section in accordance with a voltage of the battery cell using the voltage of the battery cell.

* * * * *